United States Patent
Hsu et al.

(10) Patent No.: US 8,518,743 B2
(45) Date of Patent: Aug. 27, 2013

(54) DIE STRUCTURE AND DIE CONNECTING METHOD

(75) Inventors: Chia-Hung Hsu, New Taipei (TW); Ching-San Lin, Wufeng Township Taichung County (TW); Chin-Yung Chen, Daxi Township Taoyuan County (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 160 days.

(21) Appl. No.: 13/089,480

(22) Filed: Apr. 19, 2011

(65) Prior Publication Data
US 2011/0254153 A1 Oct. 20, 2011

(30) Foreign Application Priority Data
Apr. 20, 2010 (TW) ................................ 99112293 A

(51) Int. Cl.
*H01L 21/00* (2006.01)
(52) U.S. Cl.
USPC .................. 438/107; 257/737; 257/E23.021; 257/733; 436/26; 436/613

(58) Field of Classification Search
USPC ................. 257/737, 733, E23.021; 438/613, 438/26, 107
See application file for complete search history.

(56) References Cited

U.S. PATENT DOCUMENTS

| | | | |
|---|---|---|---|
| 7,462,942 B2 * | 12/2008 | Tan et al. ...................... | 257/782 |
| 2006/0055032 A1 * | 3/2006 | Chang et al. .................. | 257/734 |
| 2011/0001250 A1 * | 1/2011 | Lin et al. ....................... | 257/778 |

* cited by examiner

*Primary Examiner* — Eva Yan Montalvo

(57) ABSTRACT

A die structure and a die connecting method using the same are provided. The die structure includes a die and a bump structure. The bump structure includes a body and a solder layer. The body is disposed on the die. The solder layer is disposed on the body. The method includes providing a die structure mentioned above, providing a circuit board mentioned above, and soldering the solder layer of the die structure with the tine layer on the copper block of the circuit board. In different embodiments, a tin layer is omitted from the circuit board, wherein the solder layer of the die structure is directly soldered onto the surface of the copper block.

2 Claims, 9 Drawing Sheets

DIE STRUCTURE AND DIE CONNECTING METHOD

CROSS-REFERENCE TO RELATED APPLICATION

This application claims priority based on Taiwanese Patent Application No. 099112293, filed on Apr. 20, 2010, the disclosure of which is incorporated herein by reference in its entirety.

BACKGROUND OF THE INVENTION

1. Field of the Invention

This invention generally relates to a die structure and a die connecting method. More particularly, this invention relates to a die structure for electrically coupling to a circuit board and a die connecting method using the same.

2. Description of the Prior Art

Among the chip-packaging technologies, flip-chip interconnect technology (FC) is generally used. In the flip-chip interconnect technology, a plurality of die pads are disposed in area array on an active surface of the die, wherein a bump structure 80 shown in FIG. 1A is formed on the die pad. After flipping the die 20, the bump structure 80 on the die 20 is coupled to a circuit 70 in the circuit board 60 shown in FIG. 1B via a conducting material 11. Afterward the die 20 is coupled to the circuit board 60 by means of the bump structure 80 and can be further electrically coupled to an external electronic device via the circuit board, as shown in FIG. 1C.

However, the conventional bump structure 80 is made up by a copper block 10 and a gold layer 40 covered thereon. It is difficult to reduce the manufacture cost due to the high price of the gold material. On the other hand, to electrically connect the bump structure 80 to the circuit board 60, a tin layer 33 must cover on the conducting material 11 for soldering with the gold layer 40. Since the tin layer 33 covering on the conducting material 11 has a certain thickness, the distance between the conducting materials 11 must be increased to prevent short-circuit. In other words, the number of the conducting materials 11 and the dies 20 that may be disposed in a given area is therefore decreased.

SUMMARY

It is an object of the present invention to provide a die structure for electrically coupling to a circuit board at lower material cost.

It is another object of the present invention to provide a die connecting method at lower manufacture cost.

The die structure of the present invention includes a die and a bump structure. The bump structure includes a body and a solder layer. The body is disposed on the die. The solder layer is disposed on the body and covers the body. The material of the solder layer is selected from the group consisting of tin, tin-lead alloy, and tin-silver alloy. The material of the body includes copper. The circuit board includes a plate, a circuit, and a copper block. The circuit is disposed in the plate. The copper block is disposed on the plate and is electrically coupled to the circuit. The circuit board further includes a tin layer disposed on the copper block.

The method includes providing a die structure mentioned above, providing a circuit board mentioned above, and soldering the solder layer on the surface of the copper block with the tin layer. The die structure of the present invention includes a die and a bump structure. The bump structure includes a body disposed on the die and a solder layer disposed on the body. The circuit board includes a plate, a circuit disposed in the plate, and a tin layer disposed on the copper block. In different embodiments, a tin layer is omitted from the circuit board, wherein the solder layer is directly soldered on the surface of the copper block.

DETAILED DESCRIPTION OF THE PREFERRED EMBODIMENT

Figure 1A:
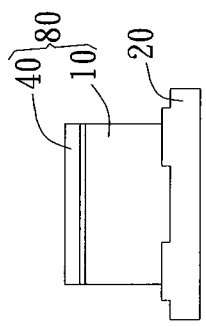
FIGS. 1A to 1C are schematic views of the prior art.
Figure 1B:
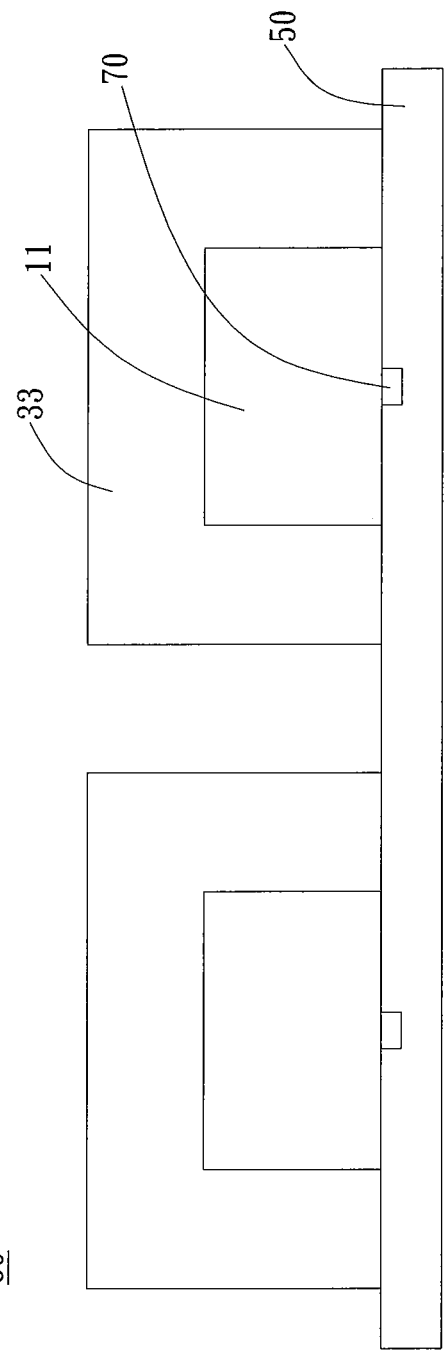
Figure 1C:
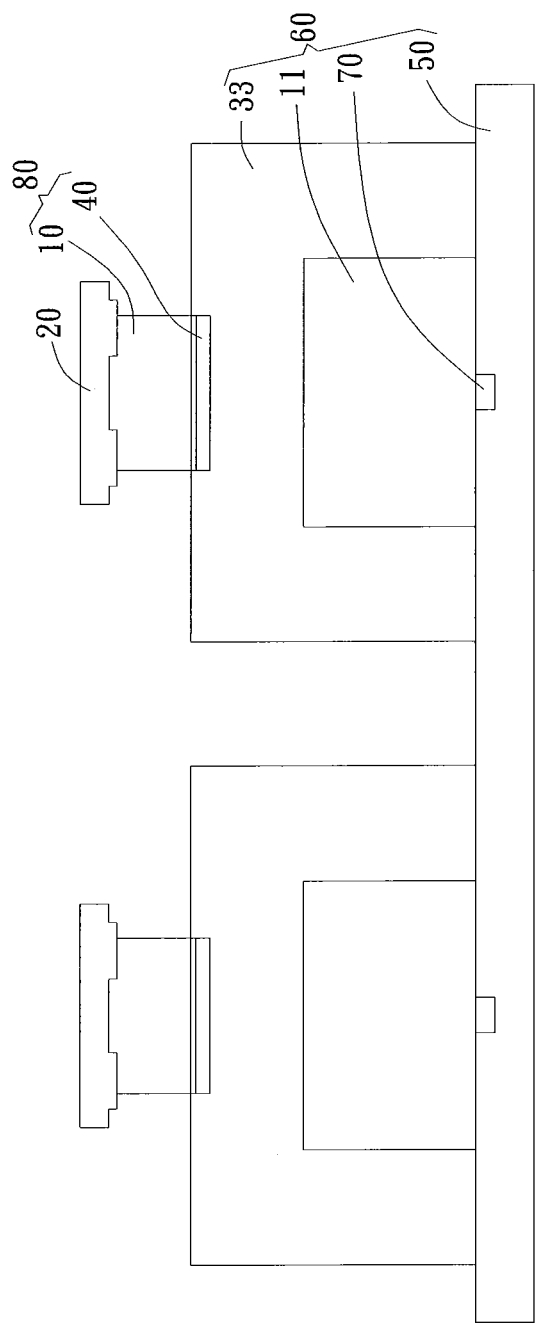
Figure 2A:
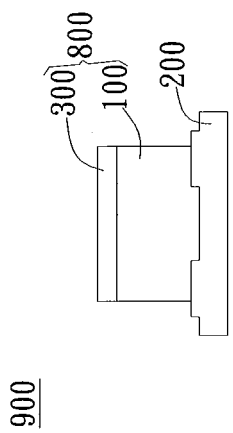
FIGS. 2A to 2C are schematic views in a preferred embodiment of the present invention.

The present invention provides a die structure capable of being electrically coupled to a circuit board, wherein the circuit board includes a rigid or soft printed circuit board having various circuits. As shown in FIG. 2A, the die structure 900 of the present invention includes a die 200 and a bump structure 800, wherein the die 200 generally refers to an integrated circuit die. The bump structure 800 includes a body 100 and a solder layer 300. The body 100 is preferably disposed on the die 200. The solder layer 300 is disposed on the body 100. The solder layer 300 is conductive and melts down when being heated up to the melting point of the solder. In the preferred embodiment, the material of the solder layer 300 is tin, wherein the melting point of the solder is about 250° C. In other embodiments, however, the material of the solder layer 300 can be selected from the group consisting of tin-lead alloy, tin-silver alloy, and other metals or alloys. The material of the body 100 is preferably copper. In other embodiments, however, the material of the body 100 can be selected from other metals or alloys having good conductivity.

Figure 2B:
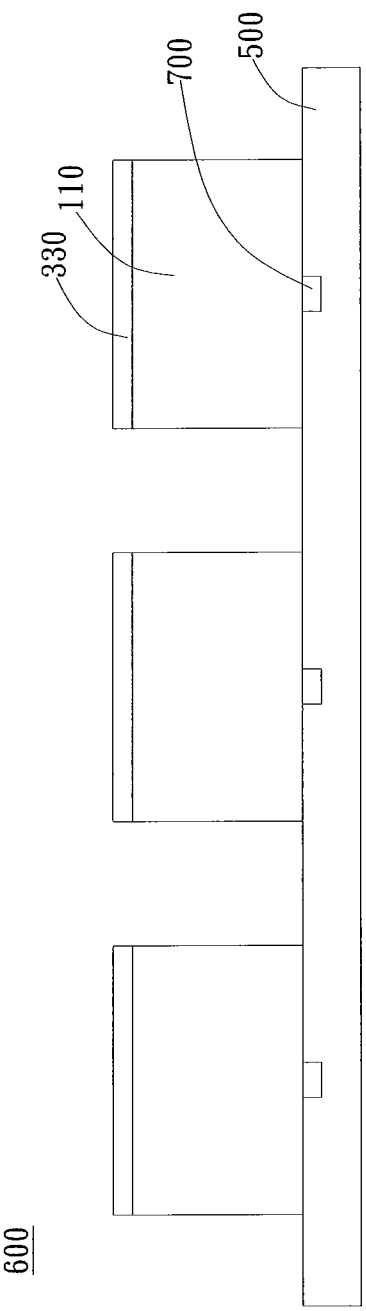

As shown in FIG. 2B, the circuit board 600 includes a plate 500, a circuit 700, a copper block 110, and a tin layer 330. The plate 500 is preferably but not limited to a polyimide film. The circuit 700 is disposed in the plate 500 by screen-printing, electroplating, or sputtering. The copper block 110 is disposed on the plate 500 and is electrically coupled to the circuit 700. The tin layer 330 is preferably disposed on top of the copper block 110.

In a preferred embodiment, the die structure 900 is electrically coupled to the circuit board 600 by simply soldering the solder layer 300 onto the surface of the tin layer 330. More particularly, a contacting area between the solder layer 300 and the tin layer 330 is locally heated to about 250° C. to melt either the solder layer 300 or the tin layer 330 and then cools down to solidify. Compared with the prior arts, since tin is used to take place of gold to serve as the solder layer 300 of the die structure 800, the material cost can be greatly reduced. On the other hand, compared with the prior arts, the thickness of the tin layer 330 on the circuit board 600 can be decreased because the solder layer 300 of the bump structure 800 is also a tin layer. Therefore, not only the material cost but also the space between the copper blocks 110 of the circuit board 600 can be reduced due to the decreased thickness of the tin layer 330. In other words, the number of copper block 110 per unit area can be increased to improve the production rate.

Figure 3A:
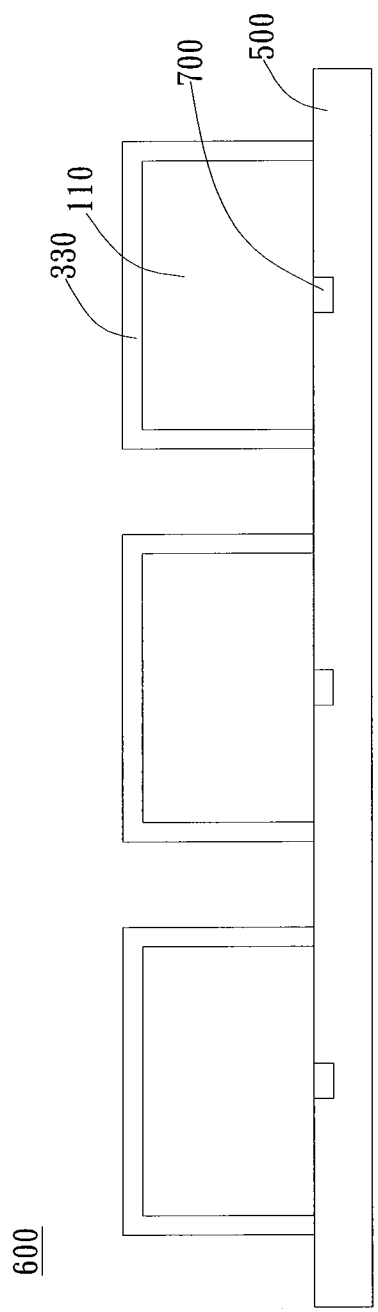
FIGS. 3A-3C and 4A-4B are schematic views in different embodiments of the present invention.
Figure 3B:
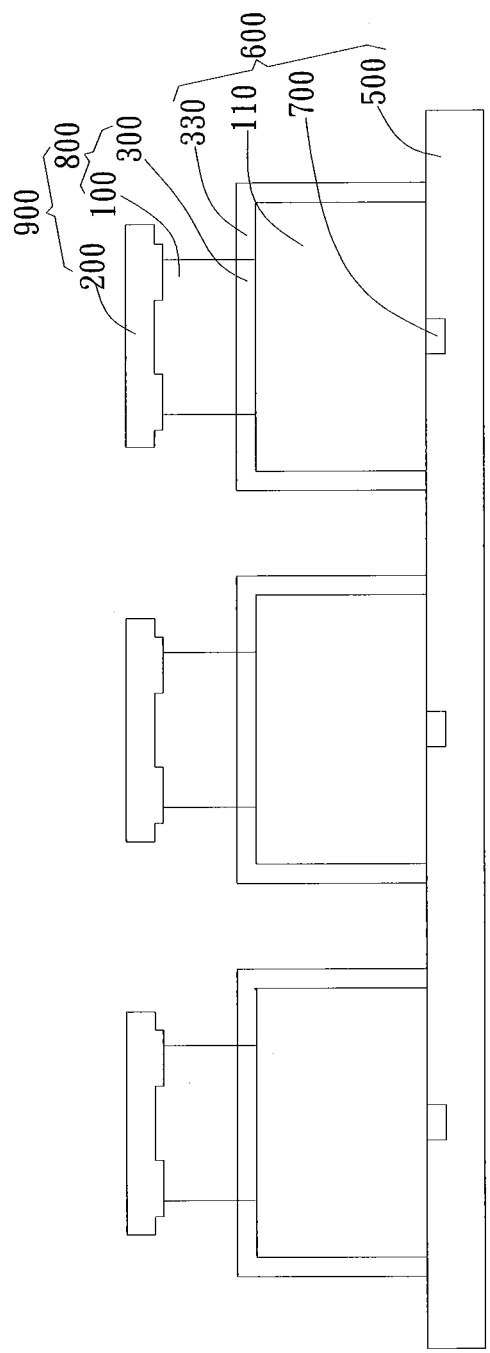
Figure 3C:
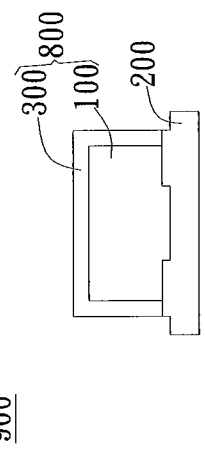

In different embodiments, the tin layer 330 can be disposed on the copper block 110 in different manners based on design requirements. As shown in FIGS. 3A and 3B, the tin layer 330 completely covers the copper block 110 to prevent the surface of the copper block 110 from being oxidized. More particularly, the conductivity of the copper block 110 will decrease if the surface of the copper block 110 is oxidized. However, if the tin layer 330 covers the copper block 110, the tin layer 330 will be oxidized prior to the copper block 110 to prevent the surface of the copper block 110 from being oxidized. Regarding the oxidation of the tin layer 330, because the reforming of the tin layer 330 will take place in the process of soldering, the influence of the oxidation of the tin layer 330 on the conductivity is insignificant. This concept can be similarly applied to the bump structure 800. In the embodiment shown in FIG. 3C, the tin layer 300 covers the body 100 to prevent the surface of the body 100 from being oxidized.

Figure 4A:
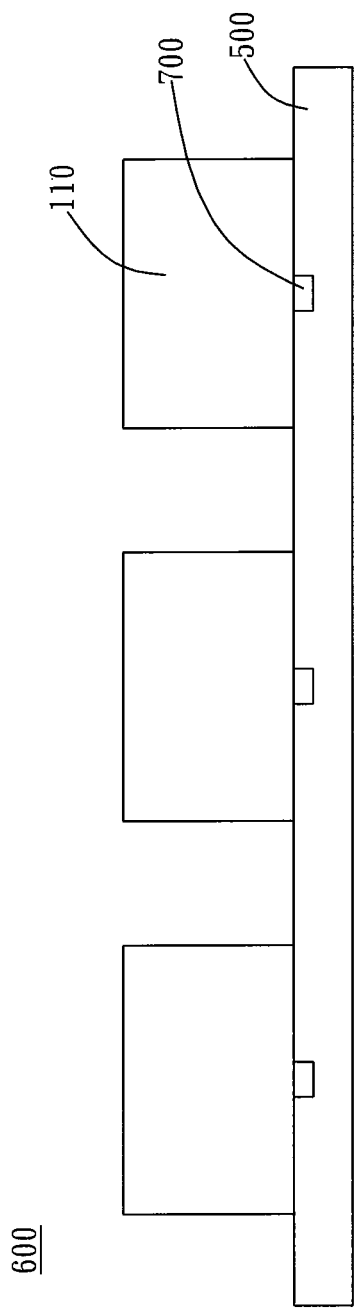
Figure 4B:
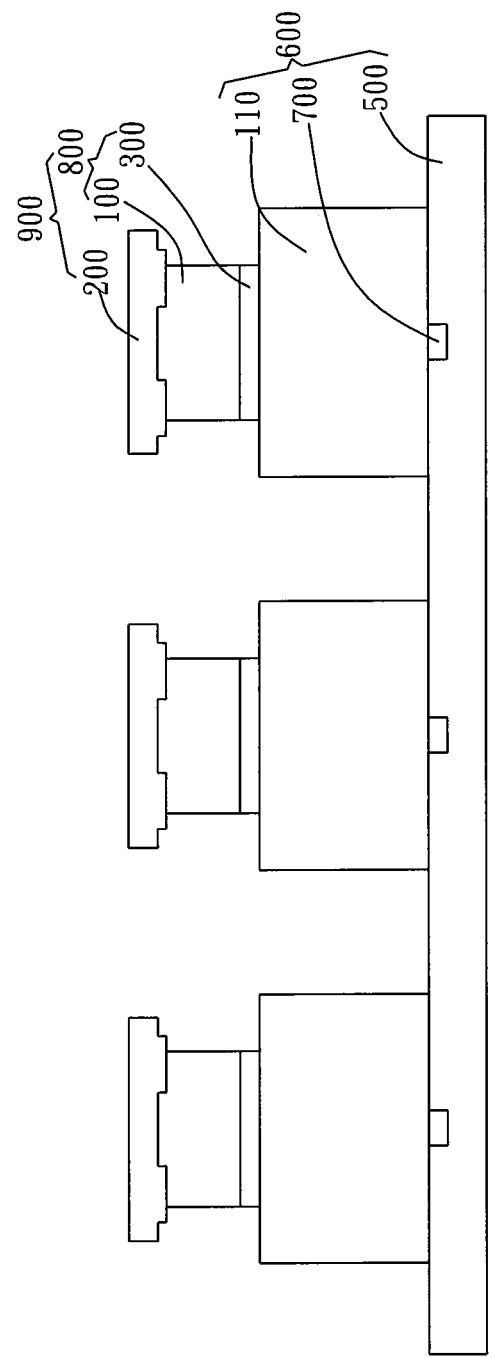

On the other hands, in different embodiments shown in FIGS. 4A and 4B, the tin layer on the copper block of the circuit board is omitted to reduce the material cost. In this embodiment, the solder layer 300 is directly soldered on the surface of the copper block 110. The surface of the copper block 110 can be polished to remove a possible oxidation layer formed when the copper block 110 is exposed in the oxygen-containing atmosphere, therefore to eliminate the impair effect of the oxidation layer on the electrical connection.

Figure 5:
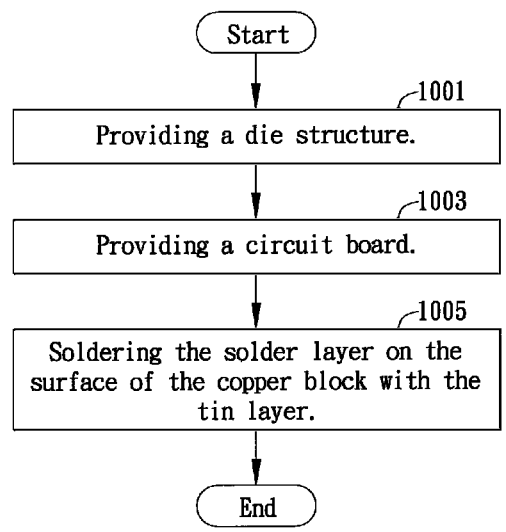
FIG. 5 is a flowchart of a preferred embodiment of the die connecting method of the present invention.

As a preferred embodiment shown in FIG. 5, the die connecting method of the present invention includes the following steps.

Step 1001, the step of providing a die structure is performed. More particularly, providing the die structure 900 shown in FIG. 2A which includes the die 200 and the bump structure 800 is preferred. The bump structure 800 includes the body 100 disposed on the die 200 and the solder layer 300 disposed on the body 100.

Step 1003, the step of providing a circuit board is performed. More particularly, providing the circuit board 600 shown in FIG. 2B which includes the plate 500, the circuit 700, the copper block 110, and the tin layer 330 is preferred.

Figure 2C:
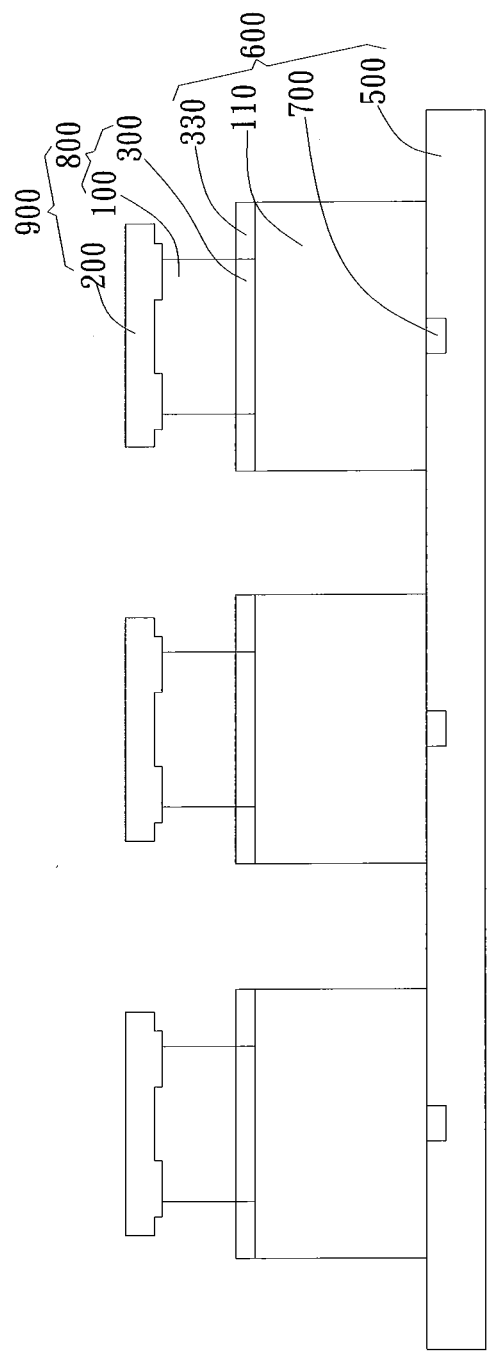

Step 1005, the step of soldering the solder layer on the surface of the copper block with the tin layer is performed. More particularly, the solder layer 300 of the die structure 900 provided in step 1001 (shown in FIG. 2C) contacts with and is soldered to the tin layer 330 of the circuit board 600 provided in step 1003. Hence the body 100 of the die structure 900 and the copper block 110 of the circuit board 600 are physically and electrically connected by means of the solder layer 300 and the tin layer 330, wherein the die 200 and the circuit board 600 are electrically connected.

Figure 6:
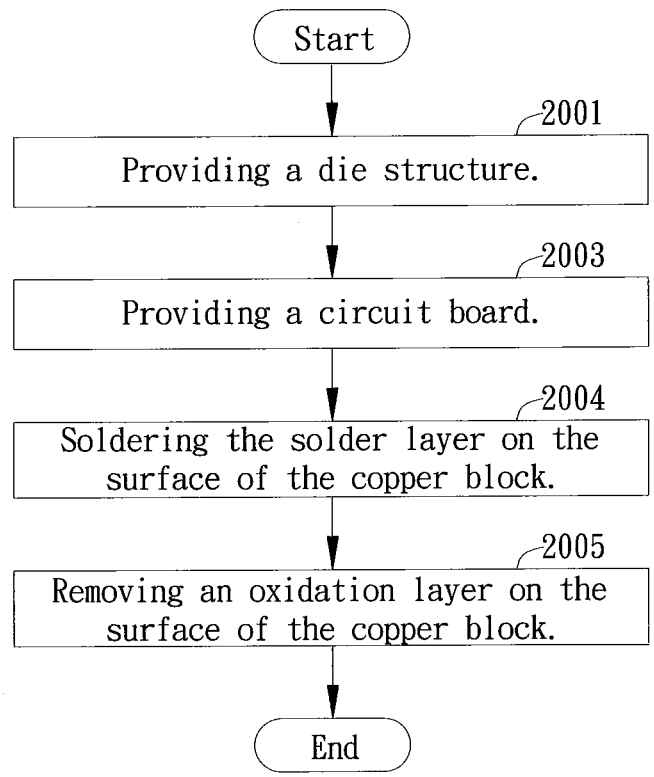
FIG. 6 is a flowchart of a different embodiment of the die connecting method of the present invention.

In a different embodiment shown in FIG. 6, the die connecting method of the present invention includes the following steps.

Step 2001, the step of providing a die structure is performed. More particularly, providing the die structure 900 shown in FIG. 2A which includes the die 200 and the bump structure 800 is preferred. The bump structure 800 includes the body 100 disposed on the die 200 and the solder layer 300 disposed on the body 100.

Step 2003, the step of providing a circuit board is performed. More particularly, providing the circuit board 600 shown in FIG. 4A which includes the plate 500, the circuit 700, and the copper block 110 is preferred.

Step 2005, the step of soldering the solder layer on the surface of the copper block is performed. More particularly, the solder layer 300 of the die structure 900 provided in step 2001 contacts with and is soldered to the copper block 110 of the circuit board 600 provided in step 2003. Hence the body 100 and the copper block 110 are physically and electrically connected by means of the solder layer 300, wherein the die 200 and the circuit board 600 are electrically connected.

In this embodiment, the method further includes step 2004 of removing an oxidation layer on the surface of the copper block before the step 2005 to eliminate the impair effect of the oxidation layer on the electrical connection is performed.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A die connecting method, comprising:
   providing a die structure, wherein the die structure includes:
      a die; and
      a bump structure including a body disposed on the die and a solder layer disposed on the body;
   providing a circuit board, wherein the circuit board includes:
      a plate;
      a circuit disposed in the plate; and
      a copper block disposed on the plate and coupling to the circuit;
   polishing the copper block of the circuit board; and
   soldering the solder layer of the die structure on a surface of the copper block of the circuit board.

2. The die connecting method of claim 1, wherein the step of soldering is performed at a temperature about the melting point of the solder layer.

* * * * *